United States Patent
Tsai et al.

(10) Patent No.: US 7,278,088 B2
(45) Date of Patent: Oct. 2, 2007

(54) CONFIGURABLE ARCHITECTURE AND ITS IMPLEMENTATION OF VITERBI DECORDER

(75) Inventors: Jia-Cheng Tsai, Tainan (TW);
Hung-Chi Lai, Kaohsiung (TW);
Jian-Hui Shen, Hsinchu (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 468 days.

(21) Appl. No.: 10/847,911

(22) Filed: May 19, 2004

(65) Prior Publication Data
US 2005/0089121 A1    Apr. 28, 2005

(30) Foreign Application Priority Data
Oct. 28, 2003    (TW)    ............................. 92129969 A

(51) Int. Cl.
*H03M 13/03*    (2006.01)
(52) U.S. Cl. .................. 714/795; 714/794; 714/792; 714/786; 714/755; 375/341; 375/262; 375/265; 702/9
(58) Field of Classification Search ........ 714/791–792, 714/786, 755, 794–796; 375/262, 265, 341
See application file for complete search history.

(56) References Cited

U.S. PATENT DOCUMENTS 5,502,735 A * 3/1996 Cooper ....................... 714/794
6,690,750 B1 * 2/2004 Hocevar et al. ............ 375/341
7,114,122 B2 * 9/2006 Shih ........................... 714/795

OTHER PUBLICATIONS

Li et al 'A new Viterbi decoder design for code rate k/n,' International Conference on Acoustics, Speech, and Signal Processing, ICASSP-95., May 9-12, 1995, vol. 4; pp. 2743-2746.*
Li et al 'A new Viterbi decoder design for code rate k/n,' IEEE, Feb. 1996, vol. 44; pp. 158-164.*

* cited by examiner

*Primary Examiner*—Guy J. Lamarre
(74) *Attorney, Agent, or Firm*—Birch, Stewart, Kolasch & Birch, LLP

(57) ABSTRACT

The present invention relates to a re-configurable Viterbi decoder. By re-setting the values of some registers, the inside control path and data path of the Viterbi decoder can be appropriately changed so as to meet the requirements of different communication systems. The Viterbi decoder comprises a branch metric calculator for receiving data items to be decoded and calculating the branch metrics; an add-compare-select unit for performing an add-compare-select operation on the output of the branch metric calculator and the corresponding path metric; a path metric storage unit (PMS unit) for saving a new path metric produced by the add-compare-select operation in an in-place way; a path memory for storing the shifted out selection bit after the add-compare-select operation; and a trace back unit for reading the selection bit of the path memory so as to perform the feedback decoding.

10 Claims, 12 Drawing Sheets

| Stage | Time | Reading State | Output of Address Generator | Number of Convolution Sections |
|---|---|---|---|---|
| 0 | 0 | 0,16,32,48 | 0,16,32,48 | 0 |
| 0 | 1 | 1,17,33,49 | 0,16,32,48 | 1 |
| 0 | 2 | 2,18,34,50 | 0,16,32,48 | 2 |
| 0 | 3 | 3,19,35,51 | 0,16,32,48 | 3 |
| 0 | 4 | 4,20,36,52 | 1,17,33,49 | 1 |
| 0 | 5 | 5,21,37,53 | 1,17,33,49 | 2 |
| 0 | 6 | 6,22,38,54 | 1,17,33,49 | 3 |
| 0 | 7 | 7,23,39,55 | 1,17,33,49 | 0 |
| 0 | 8 | 8,24,40,56 | 2,18,34,50 | 2 |
| 0 | 9 | 9,25,41,57 | 2,18,34,50 | 3 |
| 0 | 10 | 10,26,42,58 | 2,18,34,50 | 0 |
| 0 | 11 | 11,27,43,59 | 2,18,34,50 | 1 |
| 0 | 12 | 12,28,44,60 | 3,19,35,51 | 3 |
| 0 | 13 | 13,29,45,61 | 3,19,35,51 | 0 |
| 0 | 14 | 14,30,46,62 | 3,19,35,51 | 1 |
| 0 | 15 | 15,31,47,63 | 3,19,35,51 | 2 |
| 1 | 16 | 0,4,8,12 | 0,1,2,3 | 0 |
| 1 | 17 | 1,5,9,13 | 0,1,2,3 | 1 |
| 1 | 18 | 2,6,10,14 | 0,1,2,3 | 2 |
| 1 | 19 | 3,7,11,15 | 0,1,2,3 | 3 |
| 1 | 20 | 16,20,24,28 | 4,5,6,7 | 1 |
| 1 | 21 | 17,21,25,29 | 4,5,6,7 | 2 |
| 1 | 22 | 18,22,26,30 | 4,5,6,7 | 3 |
| 1 | 23 | 19,23,27,31 | 4,5,6,7 | 0 |
| 1 | 24 | 32,36,40,44 | 8,9,10,11 | 2 |
| 1 | 25 | 33,37,41,45 | 8,9,10,11 | 3 |
| 1 | 26 | 34,38,42,46 | 8,9,10,11 | 0 |
| 1 | 27 | 35,39,43,47 | 8,9,10,11 | 1 |
| 1 | 28 | 48,52,56,60 | 12,13,14,15 | 3 |
| 1 | 29 | 49,53,57,61 | 12,13,14,15 | 0 |
| 1 | 30 | 50,54,58,62 | 12,13,14,15 | 1 |
| 1 | 31 | 51,55,59,63 | 12,13,14,15 | 2 |
| 2 | 32 | 0,1,2,3 | 0,0,0,0 | 0 |
| 2 | 33 | 4,5,6,7 | 1,1,1,1 | 1 |
| 2 | 34 | 8,9,10,11 | 2,2,2,2 | 2 |
| 2 | 35 | 12,13,14,15 | 3,3,3,3 | 3 |
| 2 | 36 | 16,17,18,19 | 4,4,4,4 | 1 |
| 2 | 37 | 20,21,22,23 | 5,5,5,5 | 2 |
| 2 | 38 | 24,25,26,27 | 6,6,6,6 | 3 |
| 2 | 39 | 28,29,30,31 | 7,7,7,7 | 0 |
| 2 | 40 | 32,33,34,35 | 8,8,8,8 | 2 |
| 2 | 41 | 36,37,38,39 | 9,9,9,9 | 3 |
| 2 | 42 | 40,41,42,43 | 10,10,10,10 | 0 |
| 2 | 43 | 44,45,46,47 | 11,11,11,11 | 1 |
| 2 | 44 | 48,49,50,51 | 12,12,12,12 | 3 |
| 2 | 45 | 52,53,54,55 | 13,13,13,13 | 0 |
| 2 | 46 | 56,57,58,59 | 14,14,14,14 | 1 |
| 2 | 47 | 60,61,62,63 | 15,15,15,15 | 2 |

FIG.7A

CONFIGURABLE ARCHITECTURE AND ITS IMPLEMENTATION OF VITERBI DECORDER

BACKGROUND OF THE INVENTION

1. Field of the Invention

The present invention relates to a re-configurable Viterbi decoder. By re-setting the values of some registers, the inside control path and data path of the Viterbi decoder can be appropriately changed so as to meet the requirements of different communication systems.

2. Description of the Prior Art

In the wireless communication system, the data has to be transmitted through the air by modulating the information signal on the radio-frequency electromagnetic wave. In the receiver, the information signal is recovered from the received electromagnetic wave. However, in the transmission process, the interference inevitably happens and is partially caused by the thermal noise in the natural. Furthermore, most part of the interference is generated from the natural phenomenon of the electromagnetic wave transmission such as reflection or diffraction in the space. This causes the performance degradation in the receiver. In order to overcome this phenomenon, many communication theories and methods are proposed and discussed in the past decades. The important one is the forward error correction (FEC) technique, which is one kind of error control code commonly used in the digital communication. When FEC is used in the process of transmission, the transmitter sends not only the information data but some redundant digits generated from the information data in a specific way. If any error occurs in the process of transmission, the error will be automatically corrected through the mechanism of FEC with the assist of the redundant digits in the receiver. In the known methods of the forward error correction, the convolutional code is a very critical one and widely used in modern communication systems. So far the most common method used for the decoding of convolutional code is the Viterbi algorithm. The Viterbi algorithm is a well-established technique for channel and source coding in high performance digital communication systems. When used for decoding of convolutional codes, the Viterbi algorithm is to perform a maximum-likelihood sequence detection on data that has been convolutionally encoded.

It is an inevitable trend in the future development of the telecommunication technology to combine the wireless communication and the broad band internet. However, for different communication system specifications, such as the wireless broad band local area network (WLAN) or the third generation of mobile communication system (3G), the required convolutional code specifications are also different. To develop a design which affords to offer multi-standard function, re-configurability at run time has to be considered. The prior art Viterbi decoder is designed for a specific convolutional code, and therefore, before designing, the characteristic of the specific convolutional code has to be known and fixed, including the constraint length, and the generator polynomial. According to these known parameters, the designer can manage the add-compare-select (ACS) mechanism, the branch metric calculator (BMC), the path metric storage unit (PMS unit), the path memory and the path tracing logic unit in the Viterbi decoder to meet different system requirement. For example, if the decoding speed is the main concern in the system, then the designer can use add-compare-select (ACS) units as many as possible. The trade off is the cost increase due to the large hardware area. On the other hand, if the hardware area is the main issue that the designer has to concern first, then the number of the add-compare-select (ACS) units will be reduced in some way.

Please refer to FIG. 1. FIG. 1 is a perspective diagram of a prior art non in-place decoder with four add-compare-select units. There are two banks of memory for the storage of path metrics. The data items to be decoded are inputted into the prior art decoder, and passed through a branch metric calculator 15 so as to calculate branch metrics and then separately send the calculated results to the first add-compare-select device 11, the second add-compare-select device 12, the third add-compare-select device 13 and the forth add-compare-select device 14. At the same time, the old path metrics are read out from the path metric storage unit and also sent to the add-compare-select (ACS) devices. The circuit inside the add-compare-select devices are described as FIG. 1B. Each add-compare-select device receives the branch metrics provided from the branch metric calculator 15 and old path metrics stored in the path metric storage unit 101 or 102 as inputs, and performs the add-compare-select (ACS) operation. The selected new path metrics are stored back to another path metric storage unit, and at the same time, the selection bit is stored in the path memory. The memory address is assigned by an address generator 19, and each of the path metrics is separately distributed to the add-compare-select devices (11,12,13,14) by the multiplexer 18. The generated selection bit is stored in the path memory 16, and a path tracing logic unit 17 will read out the selection bits so as to finish the decoding. This prior art technology can achieve the object of quick decoding, but it requires a greater memory size for storage of path metrics and a higher cost because of the usage of the non in-place method.

In the prior art, it is known to use the pipeline structure for decoding. Although this prior applies the in-place operation so as to reduce the memory space, however, it is hard for re-configurability. That is, it needs more design effort to decode different convolution code specified in different system with the pipeline structure for the Viterbi decoder by applying only one set of hardware.

In order to improve the drawbacks of the prior art, the present invention provides a re-configurable Viterbi decoder. By re-setting the values of some registers, the inside control path and data path of the Viterbi decoder can be appropriately changed so as to meet the requirements of different communication systems.

SUMMARY OF THE INVENTION

The present invention relates to a re-configurable Viterbi decoder. By re-setting the values of some registers, the inside control path and data path of the Viterbi decoder can be appropriately changed so as to meet the requirements of different communication systems. The Viterbi decoder comprises a branch metric calculator for receiving data items to be decoded and calculating the branch metrics; an add-compare-select unit connected to a branch metric calculator for performing an add-compare-select operation on the output of the branch metric calculator and the corresponding path metric; a path metric storage unit (PMS unit) connected to the add-compare-select unit for saving a new path metric produced by the add-compare-select operation in an in-place way; a path memory for storing the shifted out selection bits after the add-compare-select operations; and a trace back unit for reading the selection bits of the path memory so as to perform the feedback decoding.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and in which:

FIG. 7A is the table which shows the details about the output of the address generator based on the data arrangement method (IRDA) proposed in the present invention.

DETAILED DESCRIPTION OF THE PREFERRED EMBODIMENT

The present invention relates a re-configurable Viterbi decoder. It is necessary to consider the re-configurability of the circuit designs of the add-compare-select (ACS) mechanism, the branch metric calculator (BMC), the path metric storage unit (PMS Unit), the path memory and the path tracing logic unit for the requirement of different Viterbi decoders. In the design, the present invention includes a few add-compare-select (ACS) units to form a processing element (PE). In each calculation of the new path metric, the old path metric is read out from the memory, and inputted to the processing element (PE) so as to perform the add-compare-select operation. Thereafter, the new path metric is stored back to the memory in an in-place way. Every time a codeword is received, the Viterbi decoder designed for N-state convolutional code has to finish N add-compare-select operations to determine N new path metrics. For the purpose, N sets of hardware for N individual add-compare-select operations may be used, and the kind of design would gain higher decoding speed due to parallel processing. The trade off would be the hardware size. On the other hand, if fewer sets of hardware designed for all add-compare-select operations are used, then the total clock cycles required to finish all add-compare-select operations are increasing. However, the hardware size is smaller. For the re-configurability of Viterbi decoder to suit different convolutional code in different communication specifications, single processing element is used in the design of the present invention. The main concern is that single-processing-element design can be used to finish different number of add-compare-select operations for different convolutional code in different clock cycles. The flexibility is the main issue in the configurable hardware design.

In order to make the single processing element (PE) capable of accomplishing all of the add-compare-select (ACS) operations, the read and write addresses of the data in the memory for storing the path metric have to be properly arranged. The present invention provides a new method for positioning the path metric, called as interleave rotated data allocation (IRDA), to resolve the problem.

Furthermore, as for the design of the trace back unit, the present invention provides an incomplete register-exchange mechanism in the processing element (PE) so that the trace back circuit unit can apply the hybrid trace-back algorithm to perform the decoding.

Figure 1A:
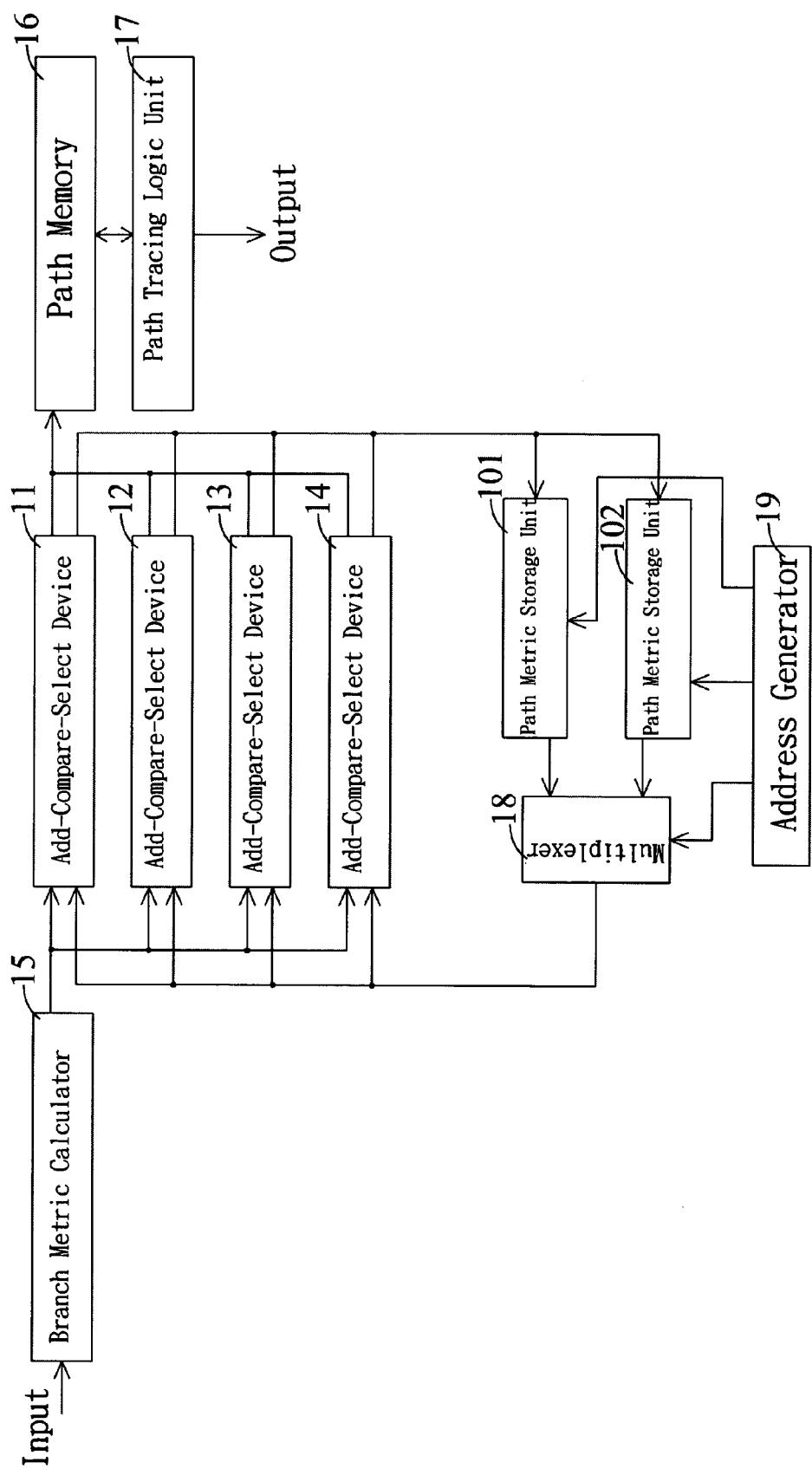
FIG. 1A is a perspective diagram of a prior art non in-place decoder.
Figure 1B:
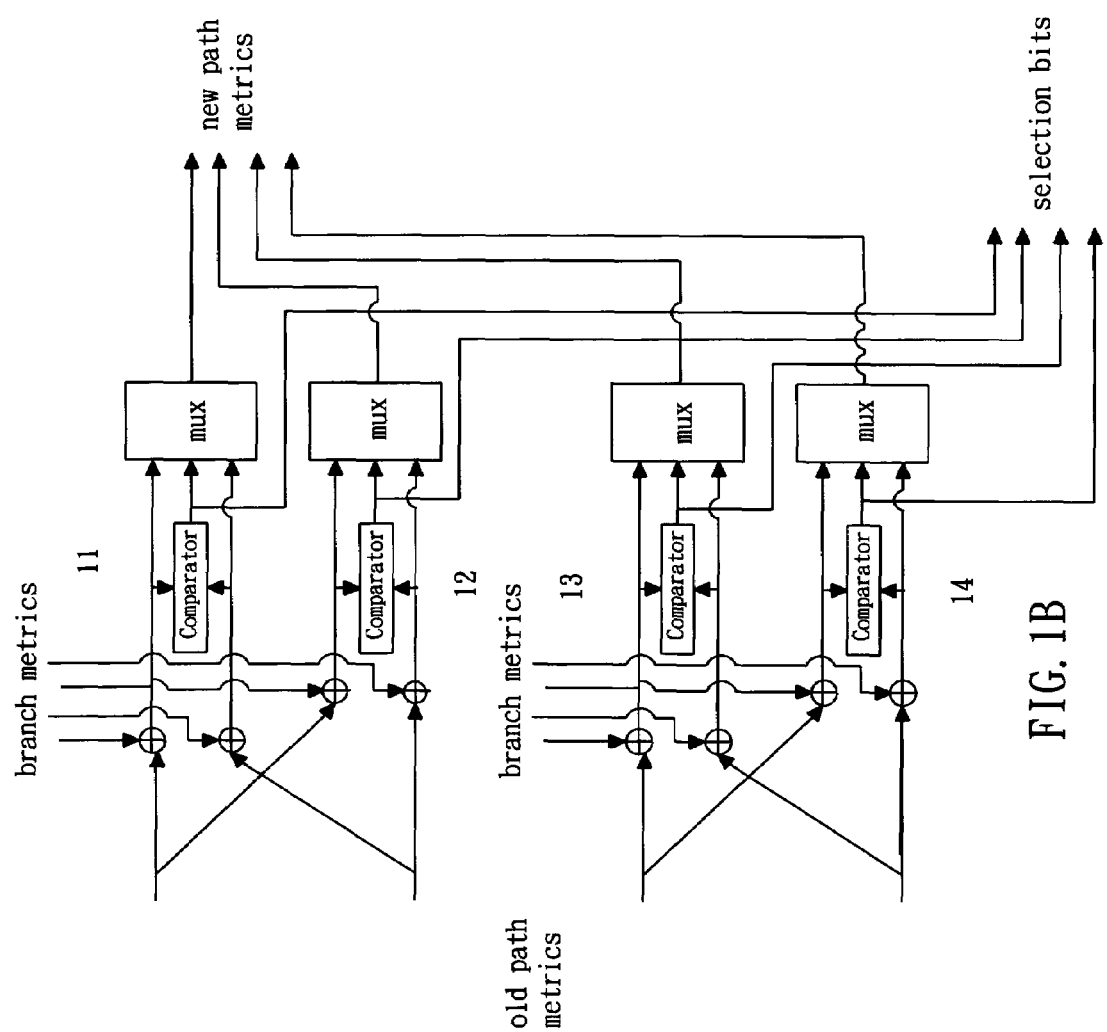
FIG. 1B show the inside of the add-compare-select devices of a prior art non in-place decoder.
Figure 2A:
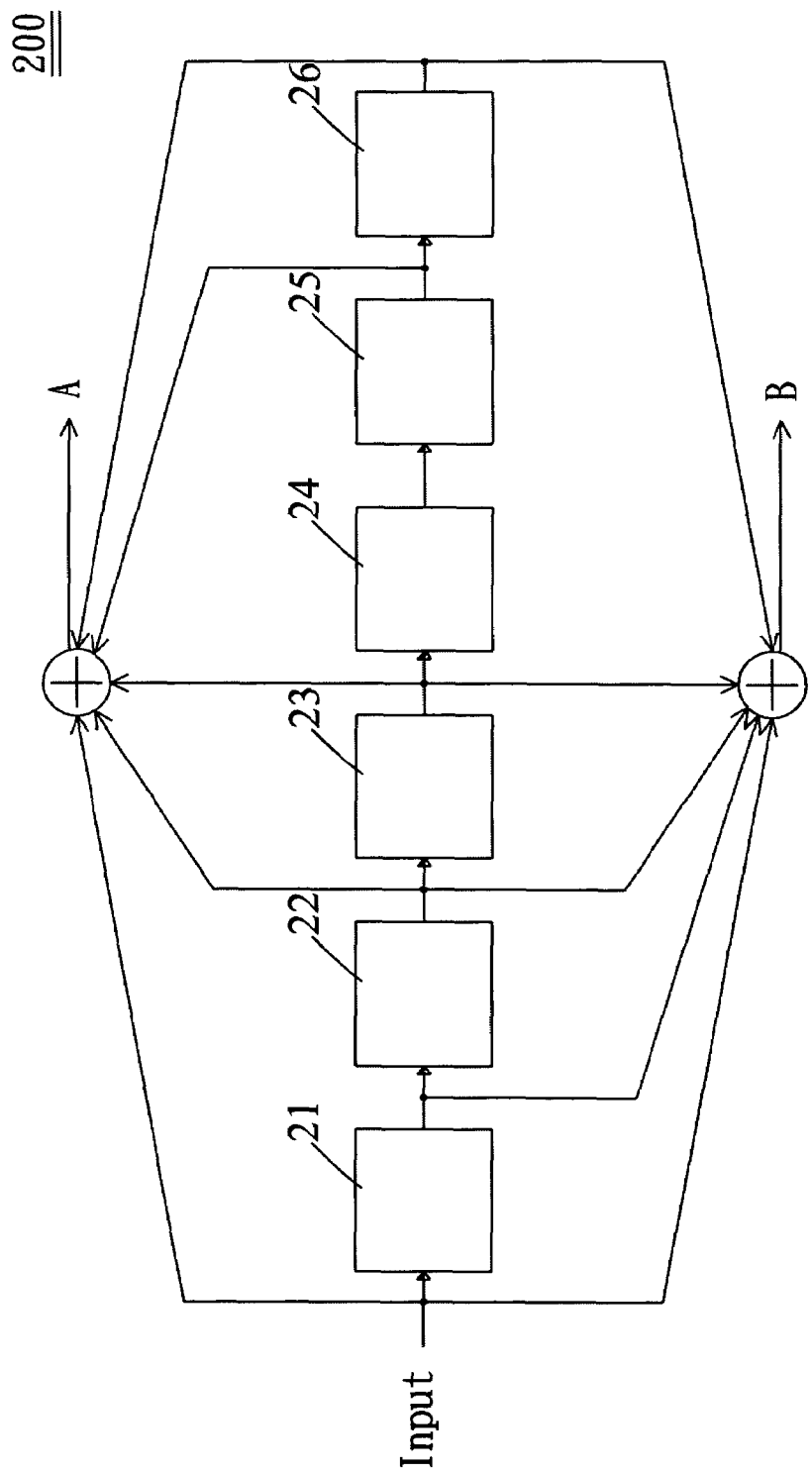
FIG. 2A is a perspective diagram of a convolutional encoder.

The Viterbi decoder is generally used in the decoding system for the communication convolutional code. Please refer to FIG. 2A. FIG. 2A is a perspective diagram of the convolutional encoder. After each of the data items is inputted to the convolutional encoder 200, the fixed form exclusive-OR (XOR) operation is performed on the inputted data items and the values previously stored in the registers (21,22,23,24,25,26) so as to obtain two output values, the first data A and the second data B as shown in the figure. The encoded data will be determined according to all of the values in the registers and the inputted data items. In the present invention, the values in the registers are represented by states. Namely, state 0 represents that from left to right, the values of these six registers are arranged as 000000, state 1 represents 100000, state 32 represents 000001, and so on.

Figure 2B:
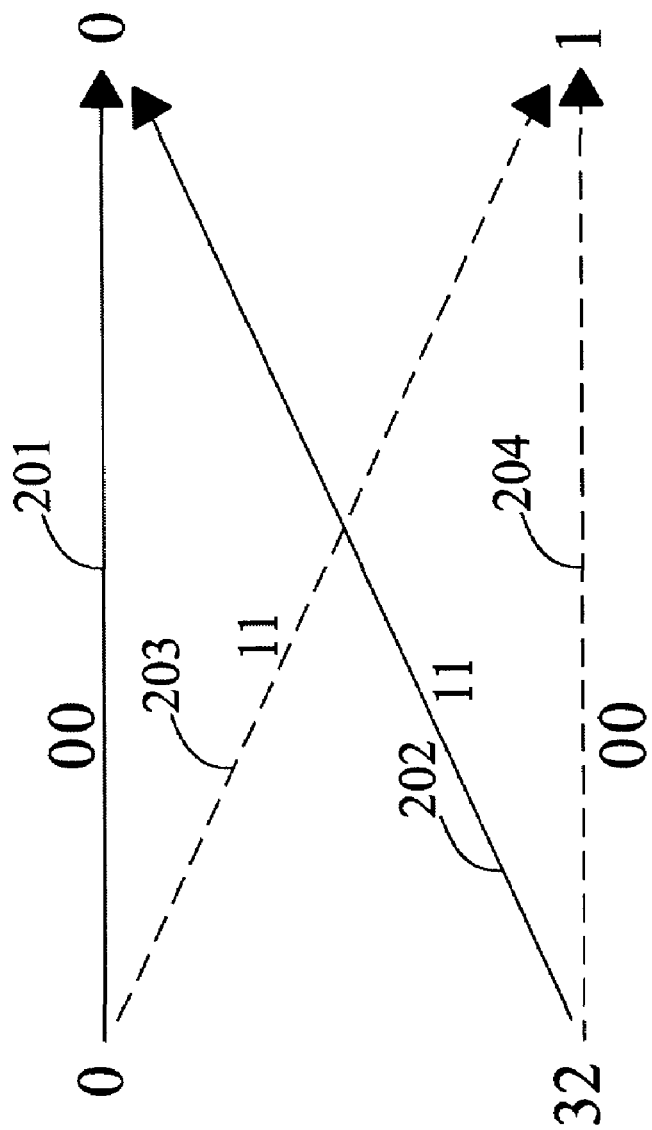
FIG. 2B shows a butterfly operation in a state transition.

Please refer to FIG. 2B. This graph is call as a butterfly graph. In this figure, one end is 0 and 32 for representing the state in FIG. 2A. The solid line represents the transition when the input data is 0, and the dotted line represents the transition when the input data is 1. Furthermore, 00 on the first solid line 201, 11 on the first dotted line 203, 11 on the second solid line 202 and 00 on the second dotted line 204 represent the output data. Take the first dotted line 203 for example, when the original state is 0, the state 0 will be transited to the state 1 and the output data 11 will be generated if the input data is 1. At the same time, because the inputted bit data is 1, the shifted register will shift out another bit data. This shifted out bit data is called as the selection bit. As for the first dotted line 203, the shifted out selection bit is 0. Generally, the encoder is initiated from the state 0. The data is continuously inputted and outputted so as to cause the continuous state transitions. These continuous state transitions are connected to form an encoding path. When the Viterbi decoder performs the decoding, it will determine the path with maximum likelihood in all of the possible paths according to all of the received data, and then use the determined path to decode all of the input data.

Figure 3:
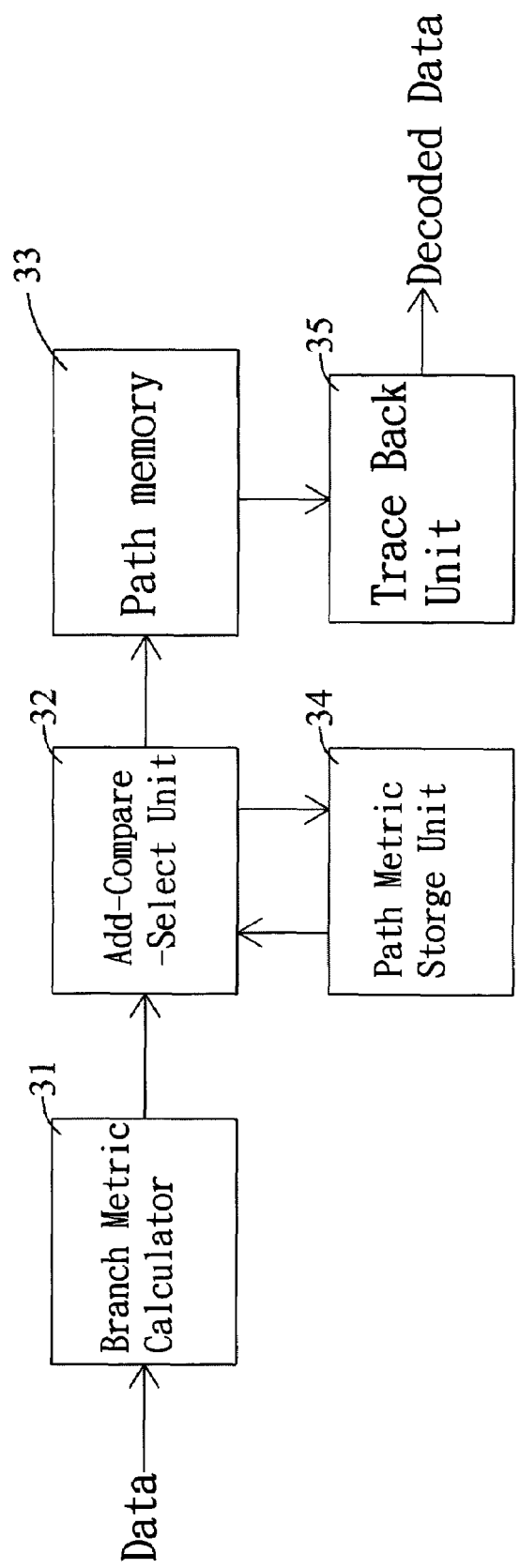
FIG. 3 is a perspective diagram of a Viterbi decoder.

Please refer to FIG. 3. FIG. 3 is a perspective diagram of a Viterbi decoder according to the present invention. The received data will pass through a branch metric calculator 31. Then the branch metrics will be obtained and sent to the add-compare-select (ACS) unit 32 of the decoder. It can be known by observing one butterfly graph, the original two states will reach the new states after the state transition, and each of the new states comes from one of the two old states (as shown in FIG. 2B). Every time a codeword is received, the Viterbi decoder designed for N-state convolutional code has to determine by which path the old N states transit to the N new states. The work is done by the add-compare-select unit 32. The path metrics of the two original states are separately added with the branch metrics so as to generate the new path metrics. Then, the two new path metrics are compared to each other, and the path with smaller path metric is selected to be the state transition in this period. Thereafter, the path metric of this new state is stored in the path metric storage unit (PMS unit) 34 in an in-place way. At the same time, the shifted out selection bit in this transition is recorded in the path memory 33. If the convolutional encoder 200 has N states, then N add-compare-select (ACS) operations have to be performed on each of the received data items so as to determine the selection bit for each state and the new path metric when decoding. Generally speaking, because there are two ACS operations needed to be executed in a butterfly graph, a butterfly operation is named to present the two ACS operation in a butterfly graph. To finish all ACS operations when a codeword is received for N-state Viterbi decoders, there are N/2 butterfly operations needed to be executed. Finally, a trace back unit 35 is used for tracing back to the input data of the original encoder so as to accomplish the decoding.

As the mentioned above, each of the butterfly operations comprises the following steps: reading out two old path metrics from the path metric storage unit (PMS unit) 34, performing two sets of add-compare-select (ACS) operations, storing the two new path metrics back to the path memory 34, and at the same time, storing the two selection bits in the path memory 33. By the operation of the decoder according to the present invention, the processing element (PE) and the operation data are properly selected so that the times of the memory access can be reduced by half and therefore, the power consumption can be decreased.

Figure 4:
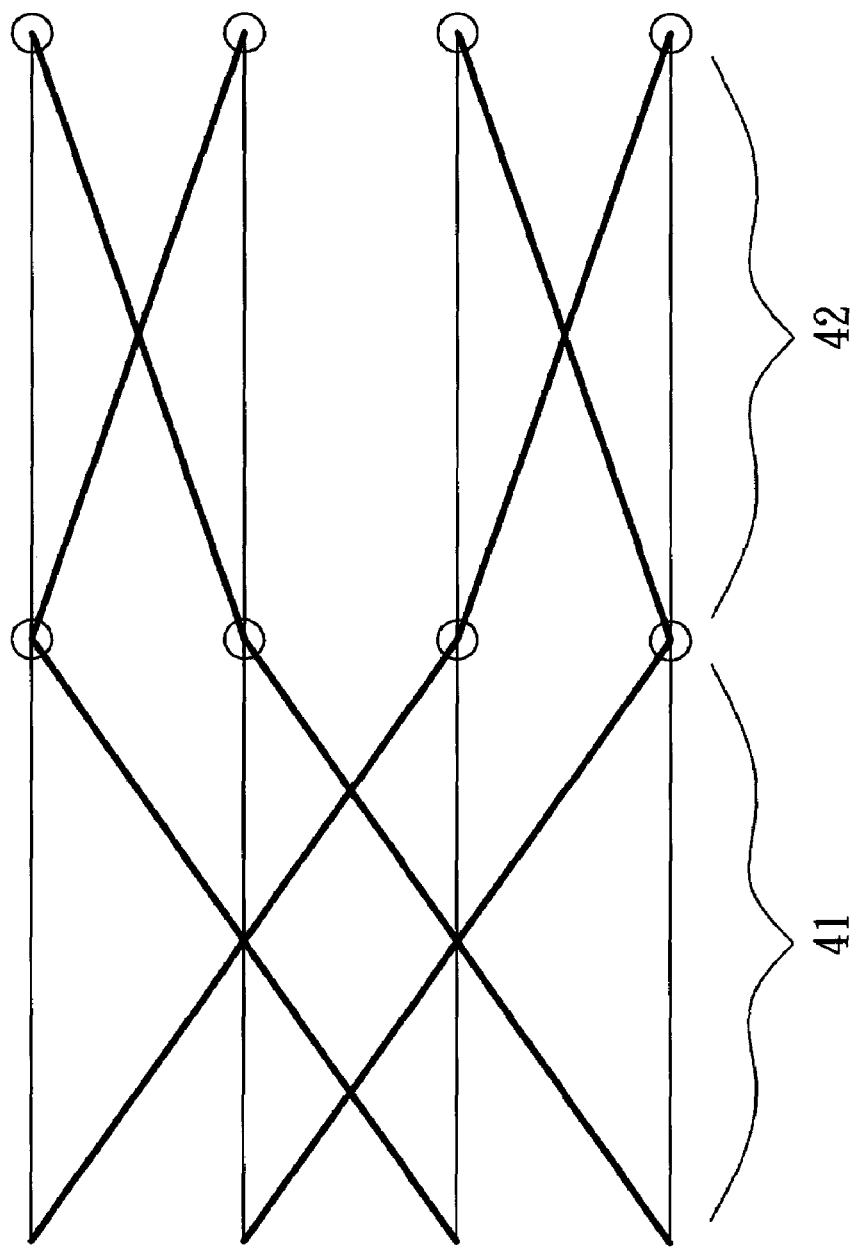
FIG. 4 shows a data operation executed by the processing element proposed in the present invention.

Please refer to FIG. 4. FIG. 4 shows a data operation executed by the processing element proposed in the present invention. In the transition between the two states, such as the first state transition 41 and the second state transition 42 as shown in FIG. 4, the processing element are designed to execute the first-transition butterfly operations and the operation results are not stored into the path metric storage unit 34 in FIG. 3 right away. In stead, the results are fed back to the input of the processing element so as to accomplish the second-transition butterfly operations. The results after the two-transition butterfly operations are then stored into the path metric storage unit in an in-place way. Therefore, the number of times of accessing to the path metric memory is so reduced by half that the power consumption can be decreased. Similarly, the number of times of writing to the path memory 33 also can be reduced by half, and by properly designing, the trace back unit 35 can perform the hybrid trace back algorithm so as to reduce the number of times of reading the path memory 33.

Figure 5A:
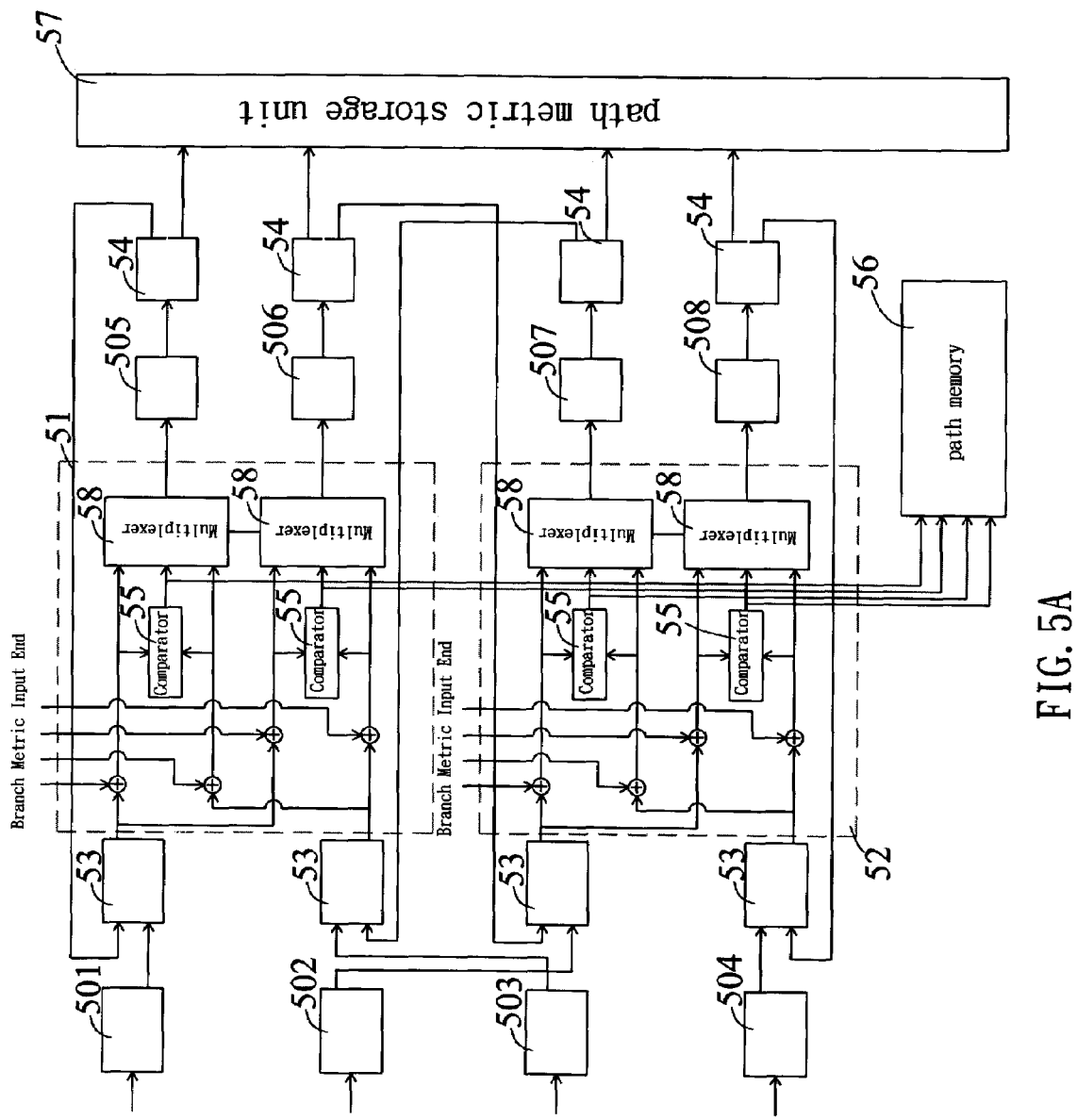
FIG. 5A is a perspective diagram of the connected portions of the processing element of the re-configurable Viterbi decoder according to the present invention.

Please refer to FIG. 5A. FIG. 5A is a perspective diagram of the connected portions of the processing element (PE) of the re-configurable Viterbi decoder according to the present invention. In this figure, two sets of butterfly processing element 51 and 52 are used to form the PE. When the operations for the first butterfly processing element 51 and the second butterfly processing element 52 are accomplished, the operation results are feedback for performing the operation of the next transition. As shown in the figure, to perform the butterfly operation, the first register 501, the second register 502, the third register 503 and the forth register 504 will separately be filled with the path metrics for each of the states via the front-multiplexers 53. At the same time, the branch metrics are calculated and put on the input side of the ACS units. Thereafter, the butterfly operation is performed in the first butterfly processing element 51 and the second butterfly processing element 52. As mentioned before, one butterfly operation contains two sets of ACS operations. The add-compare-select (ACS) is included for adding the path metrics of the two original states with the branch metrics so as to generate the new path metrics, and then comparing the two new path metrics by the comparators 55. In this way, the path with the smaller path metric is selected to be the state transition for this period. Then, the selected new path metric is sent to the fifth register 505, the sixth register 506, the seventh register 507 and the eighth register 508 via the multiplexer 58 in the processing element (PE), and then outputted to the path metric storage unit 57 through back-multiplexers 54. When performing the add-compare-select operation, the shifted out selection bit after the add-compare-select operation is recorded in a path memory 56.

Figure 5B:
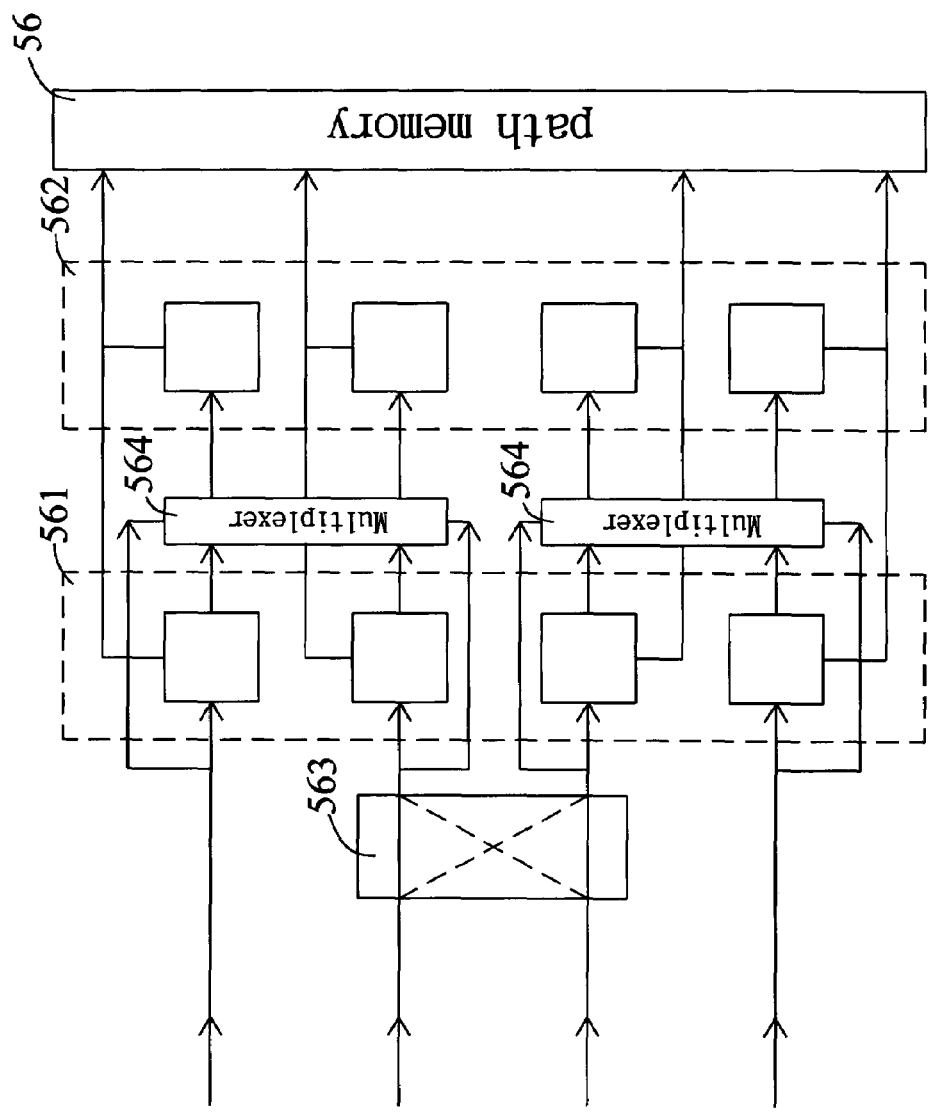
FIG. 5B is a perspective diagram of a path memory and its storage mechanism of the re-configurable Viterbi decoder according to the present invention.

As shown in FIG. 5A, in the processing element (PE) comprising the first butterfly processing element (PE) 51 and the second butterfly processing element (PE) 52, it is required to consider how to store the selection bit for decoding. The path memory 56 shown in FIG. 5B is the storage unit in the processing element (PE) for the selection bits. When performing the butterfly operations for the first transition, the switch 563 at the path memory 56 will follow the cross path in dotted line so that the selection bits will be stored in the first row of register 561. When the first-transition butterfly operations described as 41 in the FIG. 4 is finished, the calculated new path metrics are traced back to perform the second-transition butterfly operations described as 42 in the FIG. 4. Then the switch 563 will be changed to follow the path in the solid line, and via the multiplexer 564, the new selection bits generated from the second-transition butterfly operations are stored in registers 561 and used for determining how the selection bits which originally stored in registers 561 shifted into registers 562. In this way, the number of times of reading the path memory 56 will be reduced by half at tracing-back decoding, and the trace back operations for two continuous states transitions can be performed at the same time.

Figure 6A:
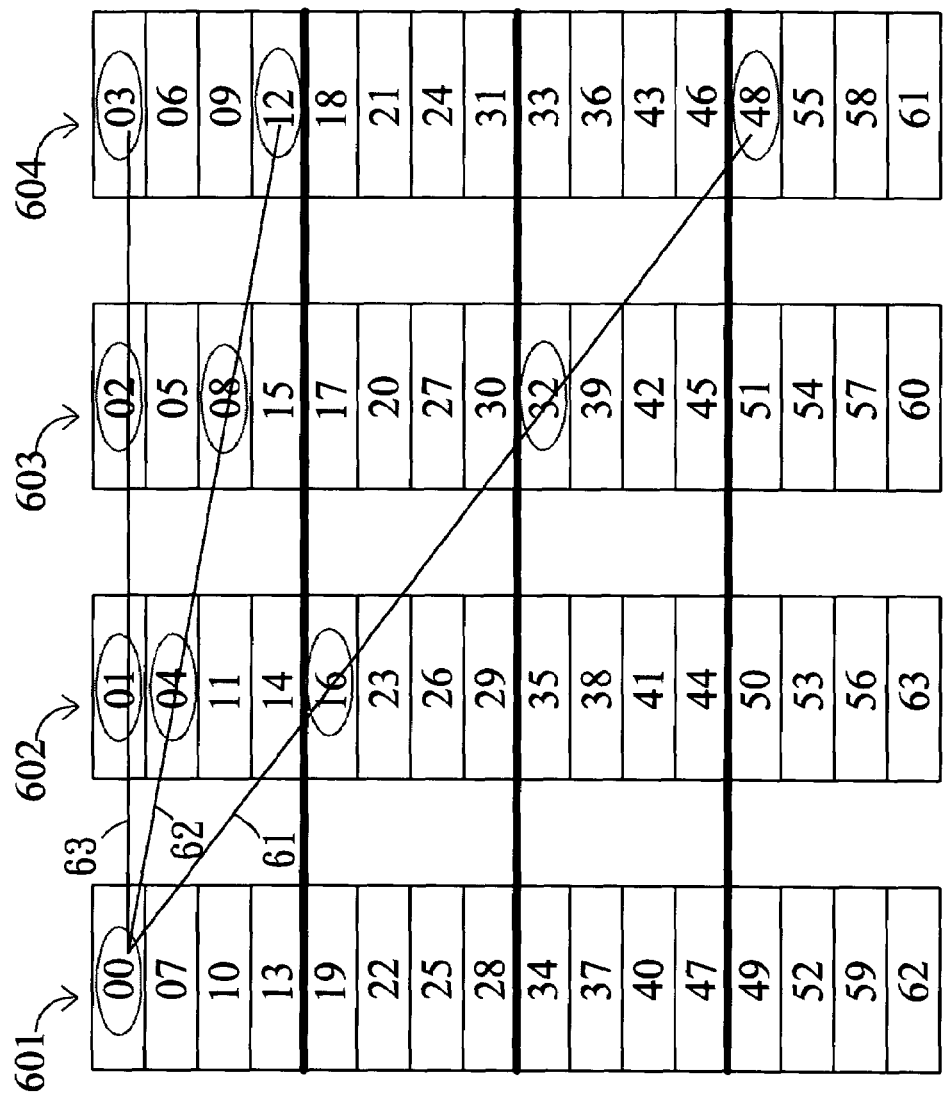
FIG. 6A is a perspective diagram of a non-conflicting data format (IRDA) of the re-configurable Viterbi decoder according to the present invention.
Figure 6B:
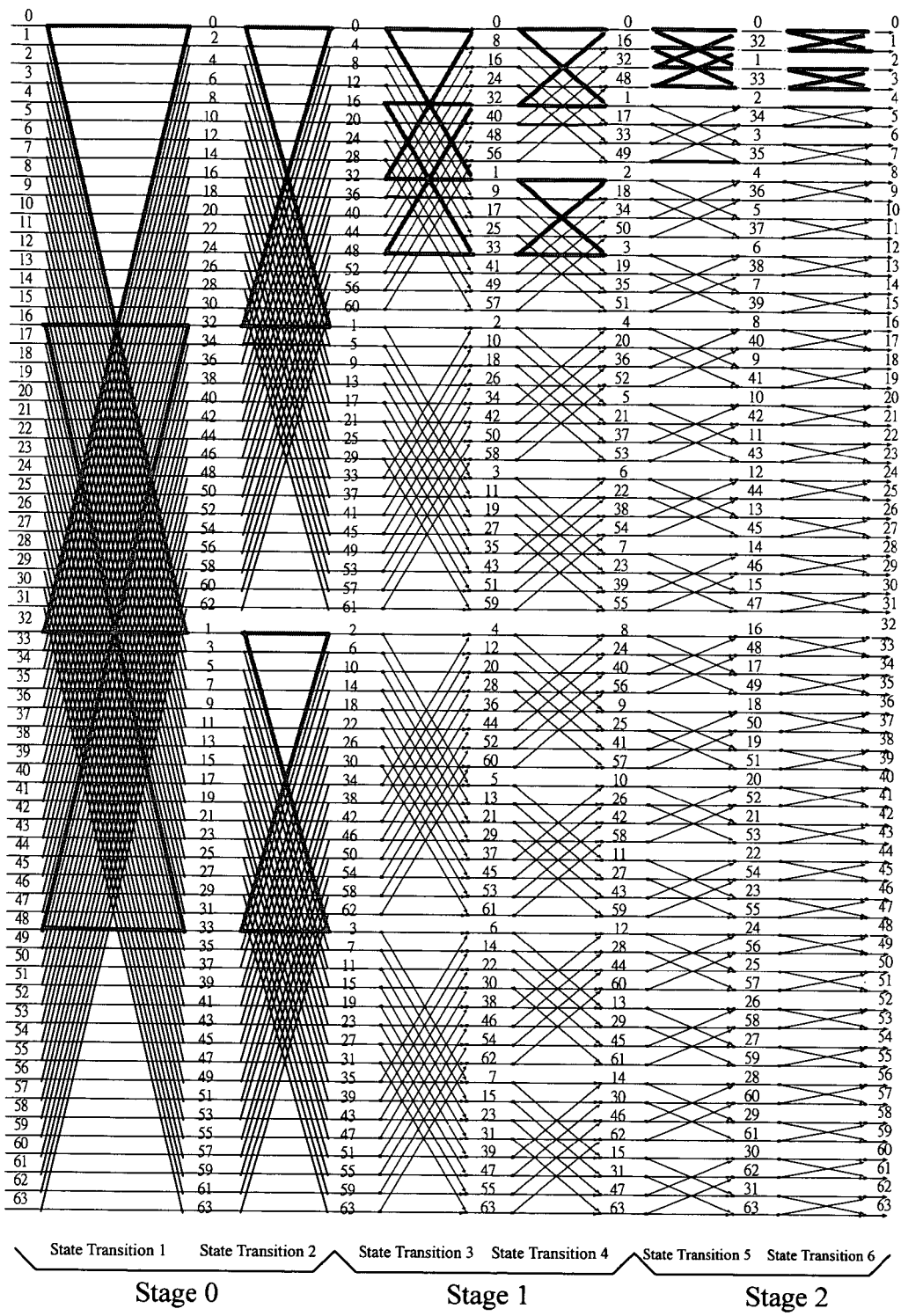
FIG. 6B is a trellis diagram which describes all possible state transitions in the convolutional code with 64 states and it shows how to finish all the add-compare-select operations by using the processing element proposed in the present invention.

The storing problem for the path metric storage unit 57 is similar to that for the required memory of the Fast Fourier Transform (FFT). The present invention applies the characteristic of the Fast Fourier Transform to use the shared memory. Here, the non-conflicting data format in the memory of the Viterbi decoder with 64 states is so used that the used memory space is reduced and the usage efficiency is increasing compared with non in-place architecture. FIG. 6B is a trellis diagram which describes all possible state transitions in the convolutional code with 64 states and it shows how to finish all the add-compare-select operations by using the processing element proposed in the present invention. The number locating above the trellis in the FIG. 6B represents the state number. As shown in the figure, every time four old path metrics are read out and inputted to the PE, the PE execute four butterfly operations shown as bold lines in FIG. 6B in each stage and then put the four new path metrics back to the path metric storage unit in a in-place way. Analogically, the same operation is repeated by 16 times so as to finish the operations for the new path metrics of all states in one stage. Because of characteristic of the in-place access, the values stored in the same memory address represents different path metric in different stage. However, every three stages, the state indices of the path metric stored in the memory addresses will be repeated. As shown in the figure, the memory where originally the path metric of state 1 stored is changed for the storage of the path metric of state 4 after one stage of operation, and for the storage of the path metric of state 16 after one more stage of operation, and back for the storage of the path metric of state 1 after total three stages of operation, and repeated. Therefore, in order to make the PE start the butterfly operation from state 0 and state 32 and from state 16 and state 48 at every stage of operation, the PE has to read out the path metrics of the sates 0,16,32,48 from the memory addresses 0,16,32,48 in the first stage, and from the memory addresses 0,4,8,12 in the second stage, and from memory addresses 0,1,2,3 in the third stage. Therefore, it is required to read from these memory addresses at same time without any conflicts in every stage. FIG. 6A shows the non-conflict data format, which called as interleave rotated data allocation (IRDA). In the re-configurable Viterbi decoder, the non-conflicting data format is used for registering the path metric items in the four memories without any conflicts. For example, the stage denoted by the first level solid line 61 comprises path metrics of the state 00 at the first memory 601, the state 16 at the second memory 602, the state 32 at the third memory 603, and the state 48 at the forth memory 604. These path metric items are separately positioned at different memories. Furthermore, the stage denoted by the second level solid line 62 comprises the path metrics of the state 00 of the first memory 601, the state 04 of the second memory 602, the sate 08 of the third memory 603, and the state 12 of the forth memory 604. They are registered at different memories, hence there is no conflict when path metrics are read out. By the same way, the third level solid line 63 connects a plurality of state positions forming non-conflicting storing format. The mentioned non-conflicting data of each stage will form a convolutional symmetrical format in the memories. In this way, the requirement for one memory with multiple ports can be effectively transformed to the requirement for a plurality of single port memories so as to reduce the used memory space.

By using the mentioned non-conflicting data format, the data in each of the horizontal row will present a convolutional symmetrical trend. Namely, the row composed of the state 04 of the second memory 602, the state 05 of the third memory 603, the state 06 of the forth memory and the state 07 of the first memory 601 is convoluted to one more address to the right than the row composed of the state 00 of the first memory 601, the state 01 of the second memory 602, the state 02 of the third memory 603, and the state 03 of the forth memory 604. The following formulas correctly present the relation of the rows:

$$R = \left\lfloor \frac{M}{r^0} \right\rfloor + \left\lfloor \frac{M}{r^1} \right\rfloor + \left\lfloor \frac{M}{r^2} \right\rfloor + \ldots + \left\lfloor \frac{M}{r^{n-2}} \right\rfloor \quad (1)$$

$$n = \operatorname{Log}_r^N \quad (2)$$

In the formula (1), M is the number of the rows of the memories. For example, the state 00, state 01, state 02, state 03 are at the 0th row. R is the number of the convolutions to the right, and r is the number of the memory ports. N represents the number of the states, and n represents the number of the stages.

As mentioned above, because the positions for storing the data are related in a convolutional symmetrical way, the proper convolution adjustment is required. Therefore, when reading the four data items, the data items have to be convoluted to the left because the data items registered in the memory are written in a convolutional way to the right. Similarly, when writing the operation results in the memory, the data items have to be convoluted to the right and then written in the memory.

Figure 7B:
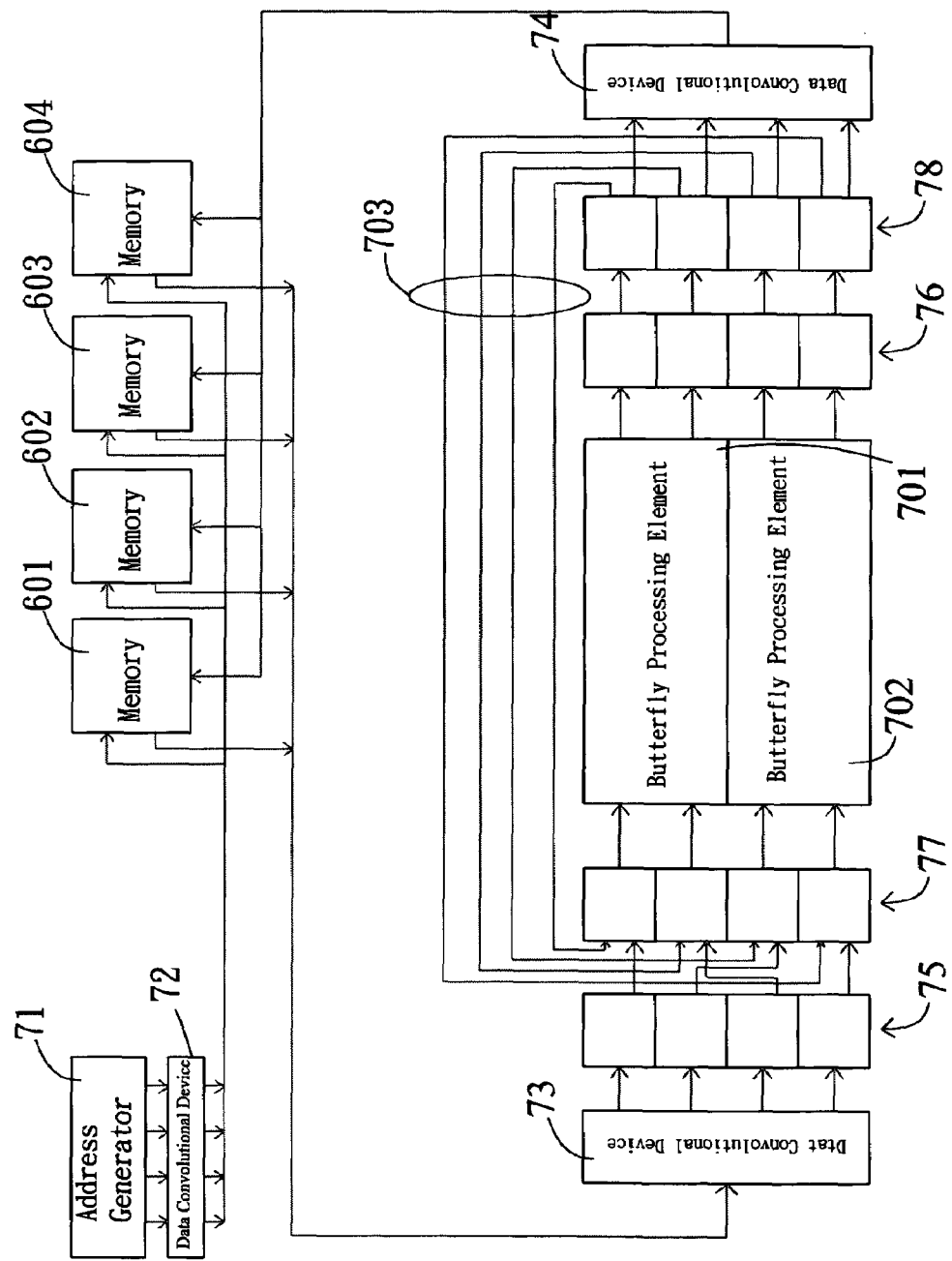
FIG. 7B is a perspective diagram showing the hardware structure of the re-configurable Viterbi decoder according to the present invention.

Please refer to FIG. 7B. FIG. 7B is a perspective diagram of a re-configurable Viterbi decoder according to the present invention. The figure shows a structure for processing four path metrics at one time. However, practically, the present invention is not limited to this. Therefore, the present invention comprises one address generator 71, two butterfly processing elements 701, 702, four single-port memories including the first memory 601, the second memory 602, the third memory 603 and the forth memory 604, the data convolutional devices 72,73,74, the registers 75, 76, the multiplexer 77 and the de-multiplexer 78.

The address generator 71 provides the addresses for the access of the memory 601, 602, 602, and 604. Because of the convolutional symmetrical characteristic of the data arrangement in the memory, data convolutional device 72 convolutes the addresses to the right so as to access right data in each memory. The path metrics are then read out and passed to the data convolutional device 73. The path metrics are convoluted to the left and sent to the first register 75. Then, the path metric items are assigned to the first butterfly PE 701 and the second butterfly PE 702 for first-transition butterfly operations by the multiplexer 77. In this operation, each butterfly PE will perform one butterfly operation, that is, two add-compare-select operations, and then store the selected results in the second register 76. Thereafter, the de-multiplexer 78 will assign the data to the feedback path 703 to be transmitted to the multiplexer 77 and then stored back to the first butterfly PE 701 and the second butterfly PE 702 for second-transition butterfly operation. Because the data is stored back after passing the feedback path 703, the external number of times of memory access can be avoided. When the operation is processed, the new path metrics are stored back in the memories 601,602,603,604 through the second register 76, the de-multiplexer 78 and the second data convolutional device 74. Here, the data convolutional device convolutes the new path metrics to the right. The same operation is continued until all of the data at the stage is processed, and thereafter, the similar operation is performed for the next stage. FIG. 7A is the table which shows the details about the output of the address generator based on the data arrangement method (IRDA) proposed in the present invention. Therefore, by applying the mentioned procedure and structure, the Viterbi decoder according to the present invention is provided so as to achieve the object of reducing the hardware requirement, lowering the power consumption, decreasing the number of operations, and most important, increasing the re-configurability for different system requirement.

The above is the detailed description of the re-configurable Viterbi decoder according to the present invention. The re-configurable Viterbi decoder having low power consumption, small area and high efficiency is suitable to be applied in the wireless communication system, such as the third generation of mobile communication system (3G), and the 802.11a, HiperLan/2, 802.16 communication system.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A Viterbi decoder comprising:
a branch metric calculator for receiving data items and calculating the branch metrics;
an add-compare-select unit connected to the branch metric calculator for performing add-compare-select operation so as to generate new path metrics and a selection bit;
a path metric storage unit (PMS unit) connected to the add-compare-select unit for storing path metric items by an in-place way;
a path memory for storing a shifted out selection bit after the operation of the add-compare-select unit; and
a trace back unit for reading the shifted out selection bit of the path memory for feedback decoding;
wherein the add-compare-select unit performs two-transition butterfly operations before outputting the new path metrics to the path metric storage.

2. The Viterbi decoder of claim 1, wherein the path metric items are stored in the path metric storage unit (PMS unit) in a non-conflicting data format such that, at each stage, the add-compare-select unit reads stored path metric items from different memories without any conflicts.

3. The Viterbi decoder of claim 1, wherein the add-compare-select unit receives the branch metrics provided from the branch metric calculator and old path metrics stored in the path metric storage unit as inputs, and performs the add-compare-select operation to generate the new path metrics and the selection bit.

4. The Viterbi decoder of claim 1, wherein the path metric storage unit (PMS unit) is composed of several single-port memories.

5. The Viterbi decoder of claim 1, wherein the add-compare-select unit further comprises several butterfly processing elements.

6. A Viterbi decoder comprising:
a processing element (PE) composed of several butterfly processing elements folded by hardware;
several single-port memories for storing path metric items of the Viterbi decoder;
several data convolutional devices for shifting data to the right or left;
several registers for receiving and registering the path metric items;
several multiplexers for deciding to receive the path metric items form the registers or from a feedback path and passing the path metric items to the processing element (PE); and
several de-multiplexers for receiving calculated results of the processing element (PE) and deciding to send received results to the feed back path or to the single-port memories.

7. The Viterbi decoder of claim 6, wherein the path metric items are stored in the single-port memories in a convolutional symmetrical way such that the registers receive the path metric items from different single-port memories without any conflicts.

8. The Viterbi decoder of claim 6, wherein the path metric items in the single-port memories are positioned and stored by the output of an address generator.

9. The Viterbi decoder of claim 6, wherein the data convolutional devices comprise a first data convolutional device to shift to a first direction the path metric items from the single-port memories and a second data convolutional device to shift to a second direction the received results from the de-multiplexers, and the first direction is opposite to the second direction.

10. The Viterbi decoder of claim 6, wherein the de-multiplexers are connected to the multiplexers via a plurality of feedback paths.

* * * * *